United States Patent [19]

Nakashima et al.

[11] Patent Number: 5,075,760
[45] Date of Patent: Dec. 24, 1991

[54] SEMICONDUCTOR DEVICE PACKAGE ASSEMBLY EMPLOYING FLEXIBLE TAPE

[75] Inventors: Takashi Nakashima, Nakatu; Hiroto Nabeta, Hiji, both of Japan

[73] Assignee: Texas Instruments Incorporated, Dallas, Tex.

[21] Appl. No.: 532,134

[22] Filed: May 31, 1990

Related U.S. Application Data

[63] Continuation of Ser. No. 296,165, Jan. 11, 1989, abandoned.

[30] Foreign Application Priority Data

Jan. 18, 1988 [JP] Japan ................................. 63-9054

[51] Int. Cl.5 ........................................... H01L 23/48
[52] U.S. Cl. ....................................... 357/70; 357/69; 357/72
[58] Field of Search ............................ 357/69, 70, 72

[56] References Cited

U.S. PATENT DOCUMENTS

| | | | |
|---|---|---|---|
| 4,006,047 | 2/1983 | Brummett et al. | 357/70 |
| 4,477,827 | 10/1984 | Walker et al. | 357/70 |
| 4,661,837 | 4/1987 | Sono | 357/70 |
| 4,706,105 | 11/1987 | Masuda et al. | 357/70 |
| 4,709,468 | 12/1987 | Wilson | 357/70 |
| 4,772,936 | 9/1988 | Reding et al. | 357/70 |
| 4,884,124 | 11/1989 | Mori et al. | 357/70 |

FOREIGN PATENT DOCUMENTS

| | | | |
|---|---|---|---|
| 225556 | 7/1985 | Fed. Rep. of Germany | 357/70 |
| 54-137971 | 10/1979 | Japan | 357/72 |
| 58-178544 | 10/1983 | Japan | 357/70 |
| 58-178545 | 10/1983 | Japan | 357/70 |
| 8806348 | 8/1988 | PCT Int'l Appl. | 357/72 |

OTHER PUBLICATIONS

Japanese Kokai Patent No. Sho 58[1983]-178544, Marutsuka et al., Oct. 19, 1983.

*Primary Examiner*—William Mintel
*Assistant Examiner*—Steven Loke
*Attorney, Agent, or Firm*—William E. Hiller; Richard Donaldson

[57] ABSTRACT

A flexdible film substrate carries a pattern of conductive leads and mounting pads. The conductive leads have outer lead portions, and inner lead portions which terminate near to the mounting pads. Semiconductor chips are mounted face-up on the mounting pads and connected by wire-bond connections to the inner lead portions. A transfer molding process is used to encapsulate the semiconductor device assemblies leaving the outer lead portions protruding from the encapsulated material. The flexible film substrate supports the mounting pads and conductive leads during the wire-bonding and transfer molding operations.

19 Claims, 6 Drawing Sheets

SEMICONDUCTOR DEVICE PACKAGE ASSEMBLY EMPLOYING FLEXIBLE TAPE

This application is a continuation of application Ser. No. 296,165, filed Jan. 11, 1989, now abandoned.

This invention concerns semiconductor devices. More specifically, it concerns a package structure for mounting semiconductor chips (particularly, semiconductor IC chips).

One conventional technique for assembling IC chips is the so-called TAB tape for automated bonding scheme. This TAB method makes it possible to obtain fine, multiple lead patterns with a variety of pattern design variations.

According to the TAB technique, a copper foil is bonded to a polyimide film substrate and etched to the prescribed pattern, forming leads. The inner lead portions of the leads have tips that protrude over an opening at the central portion of the substrate, and the tips are connected by gang bonding to an IC chip arranged face-down above the opening. The final packaging is realized using a potting resin sealing technique.

Hence, when a package is made using the TAB scheme, a special type of inner lead bonder is needed for bonding the inner lead portions and the IC chip; and a special potting machine is needed for resin sealing. As a result, the equipment cost is increased, and the overall cost is inevitably increased. In addition, for the above-mentioned potting resin sealing, the results of PCT (pressure cooker testing: test under a certain pressure, temperature and humidity) are poor, and the reliability is low. These are disadvantages.

The purpose of this invention is to provide a semiconductor device characterized by the feature that advantages of the TAB scheme can be realized, the cost for packaging can be reduced, the reliability increased to a level equal to that of a flat package, and the package size can be reduced.

Thus, according to this invention, a semiconductor device comprises leads having inner lead portions and outer lead portions arranged on a flexible substrate according to a prescribed pattern; a semiconductor chip mounted on the flexible substrate is connected by wire-bonding to at least some of the above-mentioned inner lead portions; and the regions other than the above-mentioned outer lead portions are transfer molded to provide an encapsulated semiconductor device.

The figures of the drawings illustrate embodiments of this invention.

Figure 1:
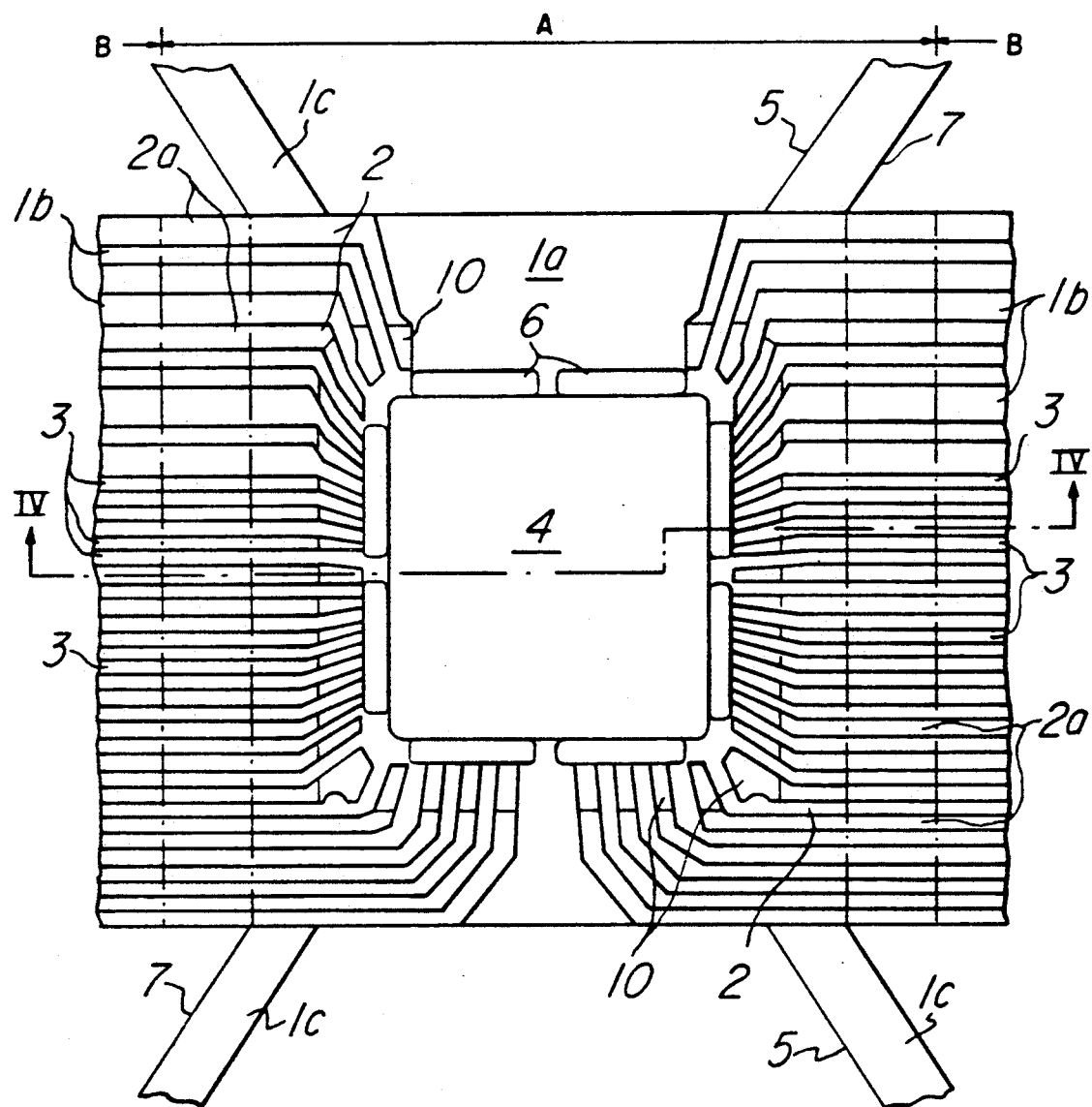
FIG. 1 is an enlarged plan view of inner lead portions on a flexible print substrate FPC.
Figure 2:
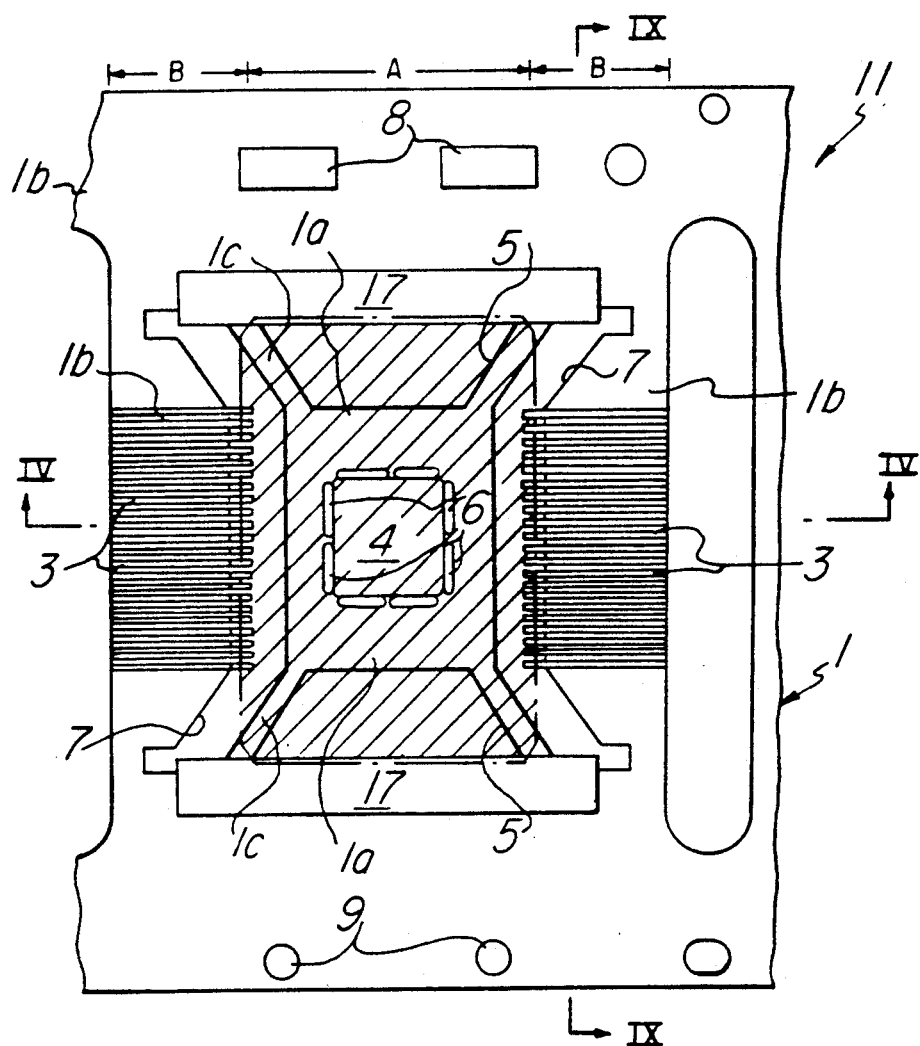
FIG. 2 is a plan view of an FPC unit with the inner lead portions not shown in the figure.
Figure 3:
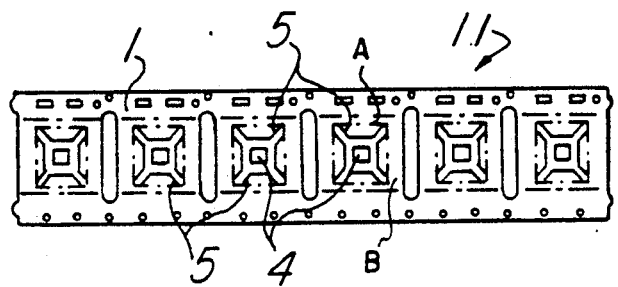
FIG. 3 is a plan view of the FPC in tape form.
Figure 4:
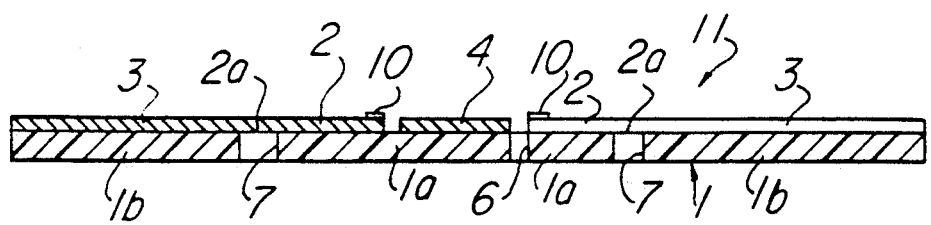
Figure 5:
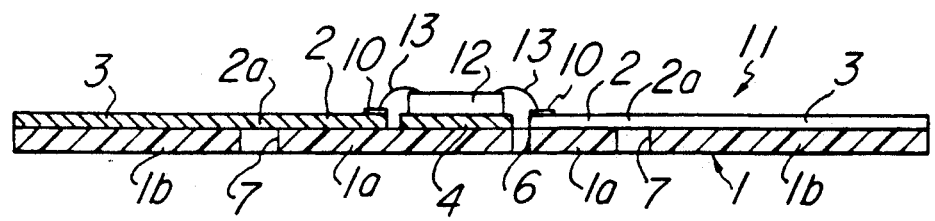
Figure 6:
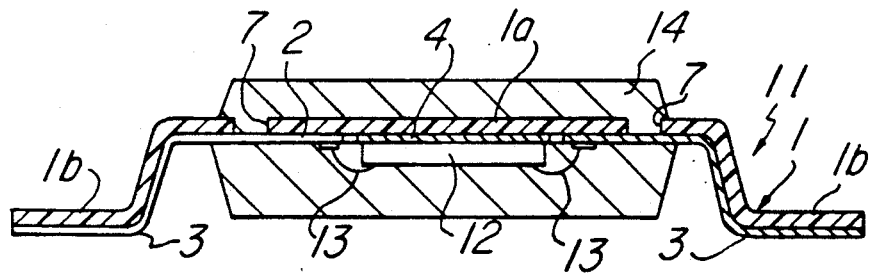

FIGS. 4, 5, and 6 are cross-sectional views along line IV—IV in FIGS. 1 and 2, illustrating the production procedure for the IC package.

Figure 7:
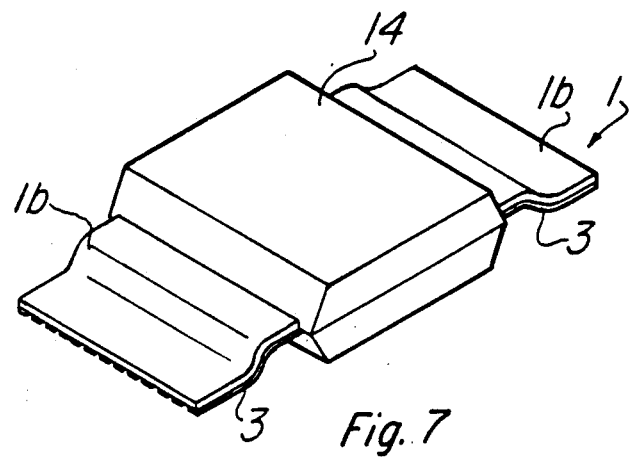

FIG. 7 is an oblique view of the package.

Figure 8:
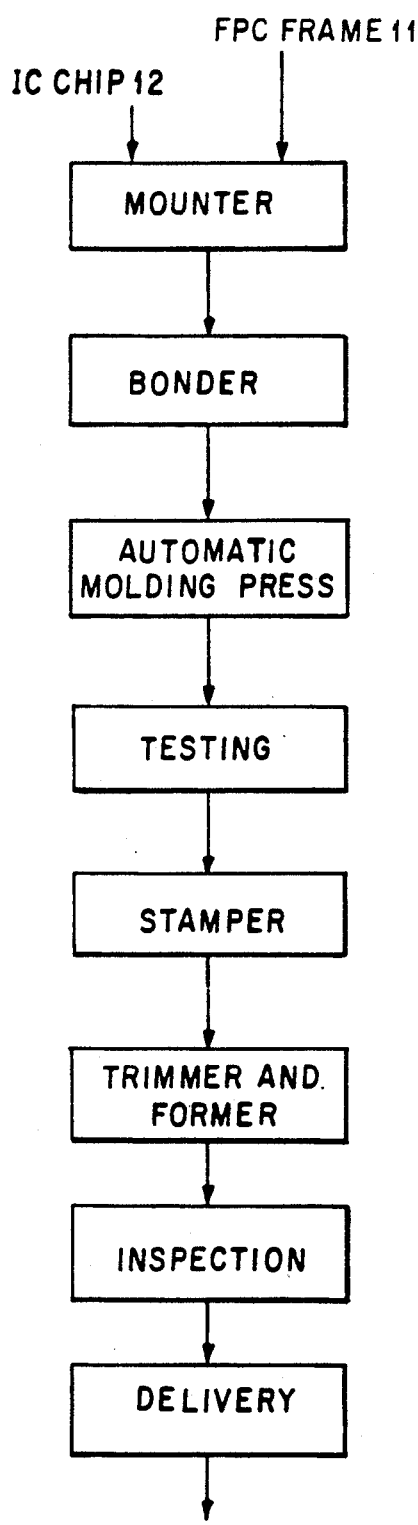

FIG. 8 is a flow diagram illustrating the preparation of an IC package.

Figure 9A:
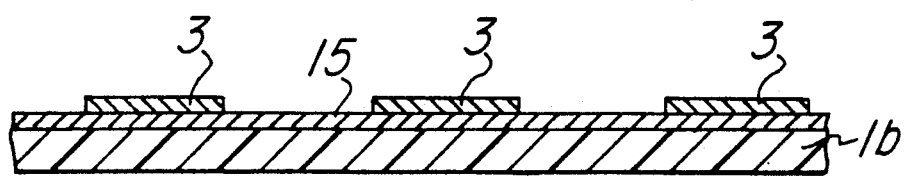
Figure 9B:
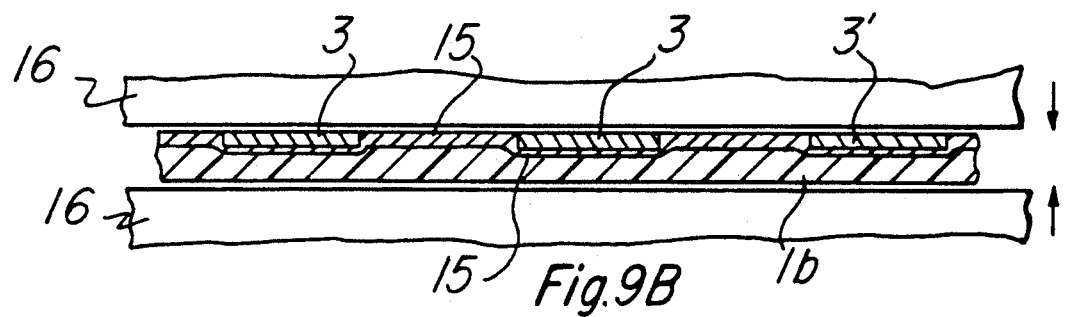

FIGS. 9A and 9B are cross-sectional views along line IX—IX in FIG. 2, illustrating the resin molding process.

Figure 10:
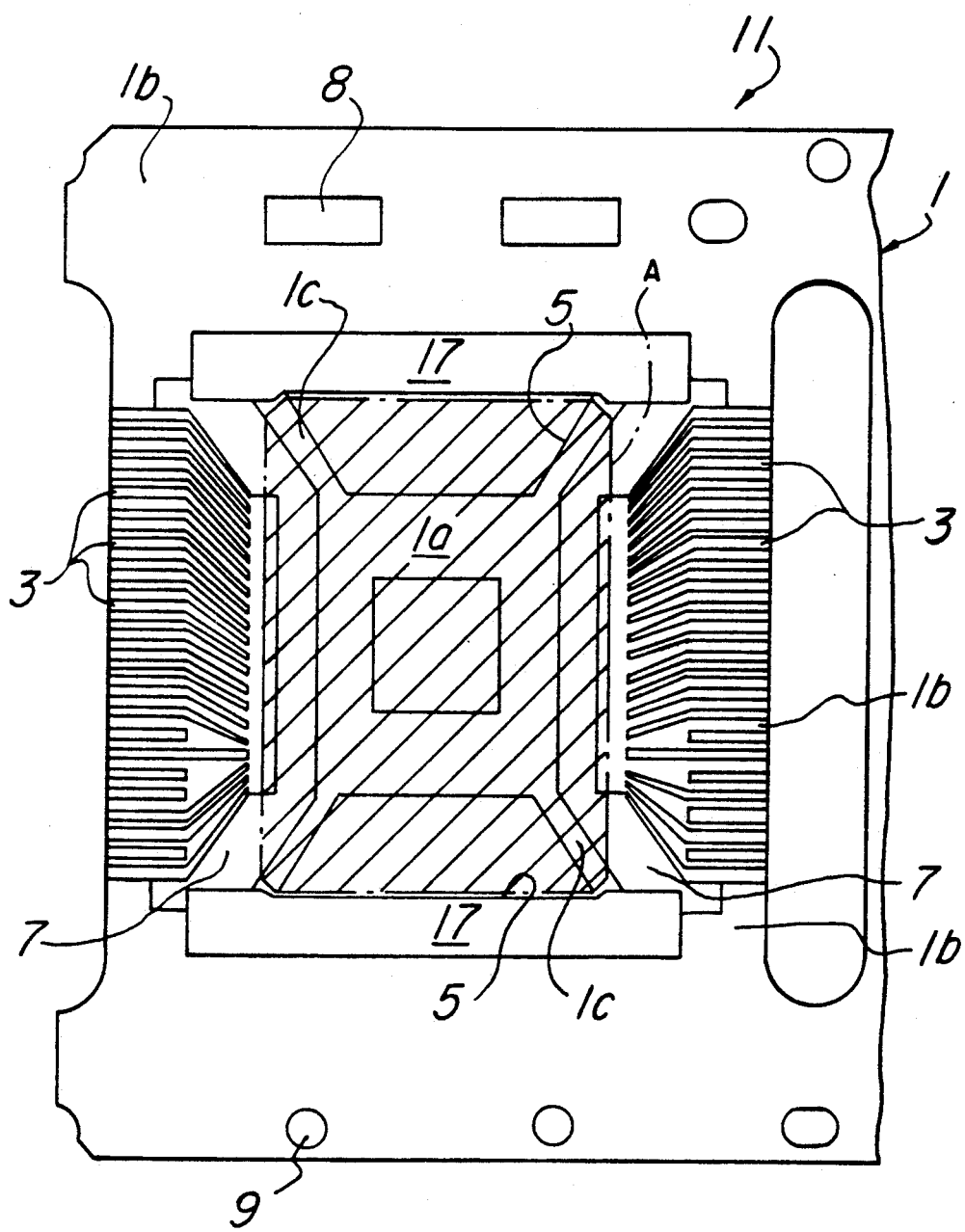

FIG. 10 is a plan view of an FPC unit in another embodiment.

FIGS. 1-9 show one embodiment of this invention.

As shown in FIGS. 1-4, a copper foil or other conductive foil is bonded by adhesive not shown in the figure on a polyimide or other heat-resistant flexible elongate substrate film 1. The foil is etched, using a suitable known etching technique, to a prescribed pattern to form rectangular IC chip mounting pads 4 spaced along the substrate strip with conductive leads extending on opposite sides of the mounting pads generally lengthwise of the elongate substrate film. The conductive leads have inner lead portions 2 (located in region B in the Figures), formed with predetermined pitches and widths.

Rectangular support areas of the substrate film on which the rectangular chip mounting pads 4 are located are defined by through-holes 5 and 7 preformed in the substrate film by punching to leave connecting web portions 1c of the substrate film extending radially from the four corners of the rectangular areas to opposite side margins of the substrate film. Around each mounting pads 4, small through-holes 6 are preformed by punching. Through-holes 8 and 9 formed on the opposite side margins of the substrate film provide feeding holes for engagement by assembly equipment feed the substrate between various stages of the assembly process. Additionally, a pattern of raised areas (e.g. copper strips adhered to the substrate) is provided between the side margins of the substrate film and the conductive leads for stopping the mold resin flashing from the mold cavity during the molding process, i.e. so-called Dam Bar's.

As substrate 1 is absent at various through-holes 7, only the inner lead portions 2 are arranged to cross over them as bridge portions 2a. The substrate 1 exists immediately below the conductive foil of the mounting pads 4. In addition, the top surface of the above-mentioned inner lead portions 2 has plating 10 applied to facilitate wire-bonding as will be explained later.

As explained above, the flexible print substrate FPC 11 (also known as an FPC frame) is formed by arranging conductive leads with a prescribed pattern on a flexible substrate 1. The major point of difference from a conventional TAB scheme is that in constructing embodiments of the present inventions, a wire-bonding method and transfer molding method are used to encapsulate IC chips mounted on and connected to the conductive pattern on the polyimide film. In addition, the FPC frame is used for mass production.

Furthermore, the inner lead portions 2 are secured to the inner substrate areas 1a, and the tip portions do not protrude beyond those substrate areas. The IC chip mounting pads 4 are also arranged on the inner substrate areas in spaced proximity from the tip portions of the inner lead portions 2. In addition, the through-holes 6 around the mounting pads 4 as well as the through-holes 5 and 7 are also important as will be explained later.

As shown in FIG. 5, an IC chip 12 is mounted face-up on a mounting pad 4. A conventional type of wire-bonder is used to connect wire conductor 13 from the upper surface of the IC chip to the inner lead portions 2. Afterwards, as shown in FIG. 6, the regions other than outer lead portions 3, of the composite substrate i.e. the IC chip 12, its mounting pad, the inner lead portions 2a, the wire connections 13 and their underlying substrate film portions are encapsulated in resin 14, using a conventional transfer molding method, forming the packaged product shown in FIG. 7.

FIG. 8 is a flow chart illustrating the formation procedure for a flexible flat package in this embodiment.

Basically, it is the same as for a conventional lead frame flat package. However, it is desirable to change the feeding mechanism of the FPC frame 11 from a single-side hook feeding scheme to a double-side hook feeding scheme or a sprocket feeding scheme in the various machines, such as the mounter, bonder, automatic molding press, stamper (of product name), trimmer and former (finish processing to the final shape shown in FIG. 7). This is because the FPC frame has less rigidity than a conventional, self-supporting lead frame. In addition, for testing, probing is possible on the FPC frame as will be explained later.

As explained above, in a package structure embodying this invention, instead of the so-called self-supporting metallic lead frame, the FPC frame made of copper foil leads arranged on a polyimide substrate is used; hence, no special equipment as used in the TAB scheme is needed in this case, and by using a conventional existing bar mount/wire-bonder, it is possible to perform chip mounting→wire-bonding. In addition, as a transfer molding method is used for resin sealing, a conventional molding press can be used in this case, with the resultant encapsulated sealed structure having a high reliability with excellent resistance to pressure, heat, moisture, etc.

In a structure embodying this invention, desirable features of the TAB scheme, i.e., small size and multiple leads, can be maintained (for example, the pitch of outer lead portions 3 smaller than 0.1 mm, a thickness smaller than 35 $\mu$m, and a number of leads of about 100-200 can be obtained). In addition, the lead pattern can be designed at will and repair is possible during production and packaging stages. New applications such as hybrid ICs, to COG (Chip on Glass), etc., become possible. The cost for equipment used in the packaging process can be reduced. Also, reliability can be increased to about the same level as in the case of flat packaging due to the use of the transfer molding scheme. This is an epoch-making advantage as it shatters the common myth that the FPC cannot withstand wire-bonding and transfer molding.

In the inner lead portions of the FPC frame 11, the presence of the polyimide base 1a has the effect of preserving rigidity of the inner lead portions 2 during the bonding process; hence, it can fully withstand wire-bonding and transfer molding. The substrate 1a itself has a high heat resistance, and a high resistance to clamping pressure; hence, the transfer molding can also be performed without problems.

In addition, predetermined portions are removed from the polyimide base 1a, forming through-holes 5, 6, and 7; hence, in the transfer molding process, when resin enters the region, the flow of the resin becomes fluent (i.e., the flow becomes easy from the lower side to the upper side through the through-holes). In this way, the difference in pressure between the lower and upper portions of the substrate is reduced. This ensures the flatness of the FPC frame, and guarantees good performance in the molding process.

As well as the existence of the above-mentioned through-holes, the arrangement of the bridge portions 2a made only of copper foil is also important. That is, in the conventional structure copper foil bonded on polyimide, during the molding process, due to the thermal expansion and contraction of polyimide, the adhesion between polyimide and mold resin is degraded, causing a decrease in the reliability. With above-mentioned copper bridge portions 2a formed over through-holes, the adhesion and sealing properties of the resin can be increased, and ingress of moisture can be prevented.

The tip areas of the inner lead portions 2 have plating 10 applied. This plating treatment is provided to improve the reliability of the wire-bonding.

As far as resin molding is concerned, in the case of a conventional self-supporting lead frame, a resin flow restricting unit called a tie bar is arranged so that the outer lead portions around the inner lead portions are connected together. However, in an embodiment of the invention, such a tie bar is not needed. In the state shown in FIG. 9, copper outer leads 3 are bonded on the outer substrate portions 1b of the polyimide film using epoxy adhesive 15. In the molding process, the FPC is clamped from upper and lower sides by a clamp 16 see FIG. 9b along line IX—IX in FIG. 2, for transfer molding. However, when the thickness of the outer lead portions 3 is very small for example, smaller than 35 $\mu$m, the outer lead portions 3 are pressed into adhesive 15 by a certain amount due to the clamp pressure. As a result, the gap between the clamp and the FPC (i.e., flow-out channel for resin) is reduced, and resin cannot flow out. Consequently, molding becomes possible without using the tie bar as in a conventional self-supporting lead frame case. In addition, different outer leads can be separated from each other; hence probing and other tests can be implemented immediately after molding without performing post-processing such as tie-bar cutting.

As the outer lead portions 3 of the FPC frame are supported by the polyimide substrate 1b, the strength of the outer lead portions is maintained even after forming. As a result, accidental deformation (bending) is avoided in the lead portions: FIGS. 6 and 7 show the final shape of the package. The outer lead portions 3 are supported bonded by substrate 1b, while being connected to an external circuit. Even in this case, no accidental deformation of the outer lead takes place; hence, high quality bonding of the outer lead portions with an external circuit can be carried out. In particular, this scheme (support by base 1b) can be used when the outer lead pitch is smaller than 500 $\mu$m and a soldering mount cannot be used. This differs significantly from the case of a conventional TAB, where the outer lead portions are only made of copper. In addition, as the excessive copper on the region outside outer lead portions 3 can be removed by etching, leaving only the polyimide base, warpage due to the different in linear expansion coefficient between copper and polyimide in the case of transfer molding and the wire breakage phenomenon caused by this warpage can be effectively prevented.

In addition, in this embodiment, the inner lead portions 2 is are in-line extensions of the bridge portions 2a, and extend to form the outer lead portions. Hence, for the outer lead portions 3, the direction and pitch are defined at the position of bridge portions 2a of the inner lead portions. In this arrangement, pattern design and formation can be carried out easily. This is an advantage.

FIG. 10 shows another embodiment of this invention.

FIG. 10 is a plan view of the FPC frame corresponding to that in FIG. 2, with the outer lead portions 3 having a pattern different from that in the previous embodiment. The outer lead portions are designed to match the pitch corresponding to a conventional connector used for testing. In the inner lead portions (not shown in the figure), through-holes 6 can be formed in the same way as described above around IC chip mount 4. The other portions may have the same structure as in the previous embodiment. In FIG. 10, the oblique lines within the dash-dot line A indicate the region of the inner lead portions. Although not shown in the figure, the inner lead portions connected to outer lead portions 3 extend to the periphery of the mounting pads 4.

This invention has been explained above with reference to particular embodiments. However, further modifications can be made of the embodiments based on the technical ideas of this invention.

For example, as far as the patterns and the fabrication of various lead portions are concerned, the shapes, preparation process, materials, etc., of these portions are not limited to what is described above, and different variations may be made. Bonding of the leads can also be performed using methods other than those described above. In addition, the transfer molding scheme may be introduced to the existing TAB process to improve the reliability. IC chips suitable for packaging using the present invention can have a high degree of integration and multiple functions. Their requirements for multiple leads and small size can be satisfied by this invention.

As explained above, by employing this invention, with leads arranged on a flexible substrate, the chip and the inner lead portions are connected by wire-bonding, followed by transfer molding for all the regions except the outer lead portions. In this way, characteristic features of a TAB technique (multiple leads, small size, etc.) can be realized, while the cost of equipment for assembly can be reduced, and the reliability can be improved to the level of a flat package using the transfer molding scheme.

What is claimed is:

1. A semiconductor device package assembly comprising:
   a flexible non-conductive substrate film, said flexible non-conductive substrate film being patterned to provide openings therethrough and defining a flexible non-conductive base frame;
   a patterned lead frame of an electrically conductive material bonded to a surface of said flexible non-conductive base frame and having openings therein in registration with openings in said flexible non-conductive base frame, said patterned lead frame including a plurality of electrically conductive leads having inner lead portions and outer lead portions;
   said flexible non-conductive base frame being provided with apertures therein defining web portions of said flexible non-conductive base frame connecting support areas of said flexible non-conductive base frame underlying portions of said patterned lead frame bonded thereto to surrounding areas of said flexible non-conductive base frame;
   said plurality of electrically conductive leads of said patterned lead frame including electrically conductive bridge portions forming a continuation of corresponding inner lead portions and spanning at least some of said apertures in said flexible non-conductive base frame;
   a semiconductor chip mounted to said flexible non-conductive base frame in proximity to said inner lead portions;
   electrically conductive connector wires extending between said semiconductor chip and at least some of said inner lead portions and connecting said semiconductor chip to said at least some of said inner lead portions;
   a molded mass of non-conductive material encapsulating said semiconductor chip, said connector wires, a portion of said flexible non-conductive base frame in registration with said semiconductor chip and said connector wires, said web portions of said flexible non-conductive base frame and portions of said plurality of electrically conductive leads other than said outer lead portions; and
   said non-conductive molded mass extending through and filling said openings provided in said flexible non-conductive base frame and said patterned lead frame in registration therewith and spaces between adjacent inner lead portions of said plurality of electrically conductive leads including said at least some of said web portion-defining apertures in said flexible non-conductive base frame in the area spanned by said bridge portions forming a continuation of corresponding inner lead portions.

2. A semiconductor device package assembly as set forth in claim 1, wherein said patterned lead frame includes a mounting pad bonded to the surface of said flexible non-conductive base frame and disposed inwardly and in spaced relation with respect to said inner lead portions of said electrically conductive leads; and
   said semiconductor chip being secured to said mounting pad.

3. A semiconductor device package assembly as set forth in claim 1, wherein said flexible non-conductive base frame comprises a patterned polyimide film and said patterned lead frame comprises copper foil.

4. A semiconductor device package assembly according to claim 1, wherein said outer lead portions are integral extensions of said inner lead portions.

5. A semiconductor device package assembly according to claim 4, wherein said outer lead portions are in-line extensions of said inner lead portions.

6. A composite assembly for mounting a plurality of semiconductor chips thereon, said composite assembly comprising:
   an elongated tape formed of a flexible non-conductive substrate film, said flexible non-conductive substrate film being patterned to provide openings therethrough and defining an elongated flexible non-conductive base frame;
   a patterned lead frame of an electrically conductive material bonded to said elongated flexible non-conductive base frame and having openings therein in registration with openings in said elongated flexible non-conductive base frame, said patterned lead frame including respective sets of electrically conductive leads and a mounting pad bonded to a surface of said elongated flexible non-conductive base frame;
   said mounting pads being spaced lengthwise along said elongated flexible non-conductive base frame;
   said respective sets of electrically conductive leads corresponding to respective mounting pads including inner lead portions and outer lead portions extending outwardly with respect to the corresponding mounting pad;
   said inner lead portions of each set of electrically conductive leads being disposed in spaced proximity to the respective mounting pad corresponding thereto;
   said outer lead portions of adjacent sets of electrically conductive leads extending between adjacent mounting pads in bonded supported relation on said elongated flexible non-conductive base frame; and said elongated flexible non-conductive base frame being provided with apertures therein defining web portions of said flexible non-conductive base frame connecting support areas of said flexible non-conductive base frame underlying portions of said patterned lead frame bonded thereto to surrounding areas of said flexible non-conductive base frame; and said plurality of electrically conductive leads of said patterned lead frame including electrically conductive bridge portions forming a continuation of corresponding inner lead portions and spanning at least some of said apertures in said flexible non-conductive base frame.

7. A composite assembly as set forth in claim 6, wherein said elongated flexible non-conductive base frame is provided with respective pluralities of spaced apertures extending therethrough with each plurality of spaced apertures being disposed about the perimeter of a corresponding one of said mounting pads of said patterned lead frame bonded to said elongated flexible non-conductive base frame.

8. A composite assembly as set forth in claim 6, wherein the opposite margins of said elongated flexible non-conductive base frame extend outwardly with respect to said patterned lead frame of electrically conductive material bonded thereto; and said opposite margins of said elongated flexible non-conductive base frame including spaced feed apertures disposed along the longitudinal extent thereof for manipulation of said elongated flexible non-conductive base frame by assembly equipment.

9. A composite assembly as set forth in claim 6, further including a plurality of semiconductor chips respectively secured to each of said mounting pads in proximity to said inner lead portions of the set of electrically conductive leads corresponding thereto; and electrically conductive connector wires extending between each said semiconductor chip and at least some of said inner lead portions corresponding thereto and connecting the respective semiconductor chip to said at least some of said inner lead portions corresponding thereto.

10. A composite assembly as set forth in claim 6, further including a plurality of respective molded masses of non-conductive material encapsulating each of said semiconductor chips, said connector wires corresponding thereto, said mounting pads, and portions of said elongated flexible non-conductive base frame in registration with each of said semiconductor chips and said connector wires corresponding thereto, said web portions of said elongated flexible non-conductive base frame and portions of said plurality of electrically conductive leads other than said outer lead portions;

said plurality of non-conductive molded masses respectively extending through and filling said openings provided in said elongated flexible non-conductive base frame and said patterned lead frame in registration therewith and spaces between adjacent inner lead portions of said plurality of electrically conductive leads associated with the respective semiconductor chips including said at least some of said web portion-defining apertures in said elongated flexible non-conductive base frame in the area spanned by said bridge portions forming a continuation of corresponding inner lead portions; and said outer lead portions of each set of electrically conductive leads corresponding to respective semiconductor chips projecting outwardly from the respective molded masses of non-conductive material.

11. A composite assembly according to claim 6, wherein said outer lead portions are in-line extensions of said inner lead portions.

12. A composite assembly according to claim 6, wherein at least end portions of said outer lead portions extend generally parallel to the length direction of said elongated flexible non-conductive base frame.

13. A package assembly for a plurality of semiconductor devices comprising:

an elongated tape in the form of a flexible non-conductive substrate film, said flexible non-conductive substrate film being patterned to provide openings therethrough and defining an elongated flexible non-conductive base frame;

a patterned lead frame of an electrically conductive material bonded to a surface of said elongated flexible non-conductive base frame and having openings therein in registration with openings in said elongated flexible non-conductive base frame, said patterned lead frame including respective sets of electrically conductive leads and mounting pads bonded to the surface of said elongated flexible non-conductive base frame in spaced relation along the elongated extent thereof;

said electrically conductive leads in each set of said patterned lead frame having inner lead portions in spaced proximity to the mounting pad corresponding thereto and outer lead portions disposed on surface portions of said elongated flexible non-conductive base frame between adjacent mounting pads;

said mounting pads and said inner lead portions of said electrically conductive leads being disposed on support areas of said elongated flexible non-conductive base frame;

said elongated flexible non-conductive base frame having apertures formed therein defining web portions of said elongated flexible non-conductive base frame connecting said support areas of said flexible non-conductive base frame to surrounding areas thereof;

said electrically conductive leads including lead portions bridging at least some of said apertures;

said elongated flexible non-conductive base frame further including apertures therethrough disposed about the perimeter of each of said mounting pads;

a plurality of semiconductor chips, each of said semiconductor chips being mounted on a respective mounting pad in proximity to said inner lead portions of said electrically conductive leads corresponding thereto;

electrically conductive connector wires extending between each said semiconductor chip and at least some of said inner lead portions of said electrically conductive leads corresponding thereto and connecting the respective semiconductor chip to said at least some of said inner lead portions corresponding thereto;

a plurality of molded masses of non-conductive material, each of said molded masses of non-conductive material encapsulating a respective one of said semiconductor chips, said connector wires, said mounting pad, a portion of said flexible non-conductive base frame in registration with said semiconductor chip and said connector wires, said web portions of said flexible non-conductive base frame and portions of said plurality of electrically conductive leads other than said outer lead portions corresponding thereto;

each of said non-conductive molded masses extending through and filling said openings provided in said flexible non-conductive base frame and said patterned lead frame in registration therewith and spaces between adjacent inner lead portions of said plurality of electrically conductive leads in a respective set of said patterned lead frame including said at least some of said web portion-defining apertures in said flexible non-conductive base frame in the area of said lead portions of said electrically conductive leads bridging said at least some of said web portion-defining apertures; and said outer lead portions of said electrically conductive leads of each set of said patterned lead frame projecting outwardly from a respective corresponding molded mass of non-conductive material.

14. A package assembly according to claim 13, wherein said molded masses extend beyond said apertures bridged by said lead portions of said electrically conductive leads.

15. A package assembly according to claim 14, wherein at least parts of said outer lead portions extend generally parallel to the length direction of said elongated flexible non-conductive base frame between said mounting pads.

16. A package assembly according to claim 13, wherein said mounting pads are generally rectangular and said web portions extend diagonally from corners of said mounting pads.

17. A semiconductor device package assembly as comprising:

a flexible non-conductive substrate film, said flexible non-conductive substrate film being patterned to provide openings therethrough and defining a flexible non-conductive base frame;

a patterned lead frame of an electrically conductive material bonded to a surface of said flexible non-conductive base frame and having openings therein in registration with openings in said flexible non-conductive base frame, said patterned lead frame including a plurality of electrically conductive leads having inner lead portions and outer lead portions, said patterned lead frame further including a mounting pad bonded to the surface of said flexible non-conductive base frame and disposed inwardly and in spaced relation with respect to said inner lead portions of said electrically conductive leads;

said flexible non-conductive base frame being provided with apertures therein defining web portions of said flexible non-conductive base frame connecting support areas of said flexible non-conductive base frame underlying portions of said patterned lead frame bonded thereto to surrounding areas of said flexible non-conductive base frame, said flexible non-conductive base frame being further provided with a plurality of spaced apertures extending therethrough and disposed about the perimeter of said mounting pad of said patterned lead frame bonded to said flexible non-conductive base frame;

said plurality of electrically conductive leads of said patterned lead frame including electrically conductive bridge portions forming a continuation of corresponding inner lead portions and spanning at least some of said apertures in said flexible non-conductive base frame;

a semiconductor chip secured to said mounting pad so as to be mounted to said flexible non-conductive base frame in proximity to said inner lead portions;

electrically conductive connector wires extending between said semiconductor chip and at least some of said inner lead portions and connecting said semiconductor chip to said at least some of said inner lead portions;

a molded mass of non-conductive material encapsulating said semiconductor chip, said connector wires, a portion of said flexible non-conductive base frame in registration with said semiconductor chip and said connector wires, said web portions of said flexible non-conductive base frame and portions of said plurality of electrically conductive leads other than said outer lead portions; and said non-conductive molded mass extending through and filling said openings provided in said flexible non-conductive base frame and said patterned lead frame in registration therewith and spaces between adjacent inner lead portions of said plurality of electrically conductive leads including said at least some of said web portion-defining apertures in said flexible non-conductive base frame in the area spanned by said bridge portions forming a continuation of corresponding inner lead portions, said non-conductive molded mass also extending through and filling said plurality of spaced apertures in said flexible non-conductive base frame as disposed about the perimeter of said mounting pad of said patterned lead frame.

18. A semiconductor device package assembly as set forth in claim 17, wherein said non-conductive molded mass extends beyond the web portion-defining apertures provided in said flexible non-conductive base frame spanned by said electrically conductive bridge portions forming a continuation of corresponding inner lead portions of said electrically conductive leads.

19. A semiconductor device package assembly as set forth in claim 17, wherein said mounting pad as included in said patterned lead frame is generally rectangular; and said web portions of said flexible non-conductive base frame extending diagonally from corners of said mounting pad.

* * * * *